(12) United States Patent
Schneiderbanger et al.

(10) Patent No.: US 10,538,463 B2
(45) Date of Patent: Jan. 21, 2020

(54) COMPOSITE CERAMIC COMPRISING A CORROSION PROTECTION LAYER AND PRODUCTION METHOD

(71) Applicant: MTU Aero Engines AG, Munich (DE)

(72) Inventors: Stefan Schneiderbanger, Dachau (DE); Nicole Jakimov, Munich (DE); Heinrich Walter, Friedberg (DE)

(73) Assignee: MTU AERO ENGINES AG, Munich (DE)

( * ) Notice: Subject to any disclaimer, the term of this patent is extended or adjusted under 35 U.S.C. 154(b) by 664 days.

(21) Appl. No.: 15/088,290

(22) Filed: Apr. 1, 2016

(65) Prior Publication Data

US 2016/0297717 A1    Oct. 13, 2016

(30) Foreign Application Priority Data

Apr. 10, 2015    (EP) .................................... 15163098

(51) Int. Cl.

| | |
|---|---|
| *C04B 35/10* | (2006.01) |
| *C04B 35/185* | (2006.01) |
| *C04B 35/52* | (2006.01) |
| *C04B 35/565* | (2006.01) |
| *C04B 35/80* | (2006.01) |
| *C04B 35/83* | (2006.01) |
| *C04B 41/00* | (2006.01) |
| *C04B 41/50* | (2006.01) |
| *C04B 41/52* | (2006.01) |
| *C04B 41/87* | (2006.01) |
| *C04B 41/89* | (2006.01) |
| *C09D 1/00* | (2006.01) |
| *C09D 5/08* | (2006.01) |
| *C23C 14/22* | (2006.01) |
| *C23C 16/44* | (2006.01) |
| *C23C 4/134* | (2016.01) |

(52) U.S. Cl.
CPC .......... *C04B 41/5067* (2013.01); *C04B 35/10* (2013.01); *C04B 35/185* (2013.01); *C04B 35/52* (2013.01); *C04B 35/565* (2013.01); *C04B 35/803* (2013.01); *C04B 35/806* (2013.01); *C04B 35/83* (2013.01); *C09D 1/00* (2013.01); *C09D 5/08* (2013.01); *C23C 4/134* (2016.01); *C23C 14/22* (2013.01); *C23C 16/44* (2013.01); *C04B 41/5096* (2013.01); *C04B 41/87* (2013.01); *C04B 2235/3217* (2013.01); *C04B 2235/3463* (2013.01); *C04B 2235/3826* (2013.01); *C04B 2235/422* (2013.01); *C04B 2235/5224* (2013.01); *C04B 2235/5228* (2013.01); *C04B 2235/5244* (2013.01); *C04B 2235/5248* (2013.01)

(58) Field of Classification Search
CPC . C04B 41/87; C04B 41/5067; C04B 41/5096; C04B 2235/3826; C04B 2235/5228
See application file for complete search history.

(56) References Cited

U.S. PATENT DOCUMENTS

| | | | |
|---|---|---|---|
| 4,640,903 A | 2/1987 | Matsuhiro et al. | |
| 5,411,762 A | 5/1995 | Thebault et al. | |
| 5,413,972 A | 5/1995 | Hwang et al. | |
| 6,254,935 B1 | 7/2001 | Eaton et al. | |
| 6,451,416 B1* | 9/2002 | Holowczak | B32B 18/00 |
| | | | 264/125 |
| 2007/0010392 A1* | 1/2007 | Bitterlich | C04B 35/597 |
| | | | 501/98.3 |

FOREIGN PATENT DOCUMENTS

| | | |
|---|---|---|
| DE | 69407624 | 4/1998 |
| EP | 1403233 | 3/2004 |

OTHER PUBLICATIONS

Duann, Q., et al.: "Fabrication of Porous SiC/SiAJON Composites Using Semi Coke and Fly Ash as Raw Material", Materials Science Forum vol. 714 (2012) pp. 347-350.
Wood, C. A., et al.: "Microstructural Development of Calcium alpha-SiAION Ceramics with Elongated Grains", J. Am. Ceram. Soc, 82(2), pp. 421-428, 1999.
Sakai, H., et al.: "Oxidation and Microstructure of Sintered Silicon Nitride", Materials Science Research, vol. 21, Ceramic Microstructures '86, Proceedings of the International Materials Symposium, Berkeley, CA, US, Jul. 28-31, 1986, pp. 137-144 (1987).
Seeber, A. J., et al.: "Phase and microstructural evolution during the heat treatment of Sm-Ca-α-sialon ceramics", Journal of the European Ceramic Society 22 (2002) pp. 1609-1620.
Wood, C. A., et al.: "Phase relationships and microstructures of Ca and Al-rich α-sialon ceramics", Journal of the European Ceramic Society 20 (2000) pp. 357-366.
Xie, R.-J., et al.: "Preparation of Ca-alpha-sialon Ceramics with Compositions along the Si3N4-1/2 Ca3N2:3AIN Line", Z. Metallkd. 92 (2001) 8, pp. 931-936.
Walls, P. A., et al.: "Reaction Mechanisms in the Formation of Calcium and Yttria α'-β' Sialon Composites", British ceramic Proceedings (1986), No. 37, pp. 35-50.
Zhao, H., et al.: "The Effect of Processing Conditions on the Microstructures of α-SiAION Ceramics", Materials Science Forum vols. 325-326 (2000) pp. 213-218.

(Continued)

*Primary Examiner* — Melissa A Rioja
(74) *Attorney, Agent, or Firm* — Abel Schillinger, LLP

(57) ABSTRACT

The present invention relates to a component of a turbomachine made of a composite material comprising a ceramic matrix and a corrosion protection layer arranged on the composite material. The corrosion protection layer comprises: 50-80 wt % silicon, 12-30 wt % nitrogen, 2-8 wt % oxygen, 2-8 wt % aluminum, and 0-3 wt % of at least one alkaline earth metal. The invention furthermore relates to a method for producing a corresponding component of a turbomachine.

20 Claims, 2 Drawing Sheets

(56) References Cited

OTHER PUBLICATIONS

Hewett, C. L., et al.: "Thermal Stability of Calcium α-sialon Ceramics", Journal of the European Ceramic Society 18 (1998) pp. 417-427.
Ya-Wen, L., et al.: "Effect of processing on toughness of Ca α-sialon ceramics", Journal of Materials Science 35 (2000) pp. 5817-5821.

* cited by examiner

COMPOSITE CERAMIC COMPRISING A CORROSION PROTECTION LAYER AND PRODUCTION METHOD

CROSS-REFERENCE TO RELATED APPLICATIONS

The present application claims priority under 35 U.S.C. § 119 of European Patent Application No. 15163098.5, filed Apr. 10, 2015, the entire disclosure of which is expressly incorporated by reference herein.

BACKGROUND OF THE INVENTION

1. Field of the Invention

The present invention relates to a component of a turbomachine of a composite material comprising a ceramic matrix and a corrosion protection layer arranged on the component, as well as to a method for producing such a component of a turbomachine.

2. Discussion of Background Information

Composite ceramics comprising a ceramic matrix, into which in particular ceramic fibers are incorporated, i.e. so-called CMC (Ceramic Matrix Composite) materials are advantageous materials for components of turbomachines, for instance of static gas turbines or aircraft engines, since they are substantially resistant to aggressive ambient conditions and high temperatures, and furthermore have high strength values even at high temperatures.

Such fiber-reinforced ceramics are usually formed from aluminum oxide, silicon carbide, carbon or mullite, in which case the incorporated fibers may be formed from the same materials. In particular, the fibers and the matrix may have an identical or similar chemical composition, for example carbons reinforced with carbon fibers, silicon carbides reinforced with silicon carbide fibers, or aluminum oxides reinforced with aluminum oxide fibers. Mixtures, however, are also possible, for example silicon carbides reinforced with carbon fibers.

Although in many cases these materials already have a sufficient high-temperature stability in atmospheres containing oxygen, under certain ambient conditions, for example in atmospheres containing steam, damage to the material may occur, when, for example in the case of composite ceramics comprising silicon carbide, volatile silicon hydroxide compounds are formed in the presence of steam.

For this reason it is necessary to protect the above-described composite ceramics against aggressive atmospheres and corrosive media by a corrosion protection layer.

From the prior art, it is already known to provide protective layers based on barium-strontium aluminosilicates (BSAS) or based on silicates of rare earths (RE) (RE-SiO$_5$ or RE-Si$_2$O$_7$). However, protective layers based on these materials have the disadvantage that they are inclined to glass phases which do not form sufficient protection, and with these layers the problem also arises that they may form volatile silicon hydroxide compounds in the presence of steam.

In view of the foregoing, it would be advantageous to have available a component for a turbomachine of a composite ceramic comprising a corrosion protection layer arranged on the composite ceramic, as well as a corresponding method for its production, with which the disadvantages of the prior art are reduced or avoided, and in particular the corresponding component is insensitive to aggressive atmospheres and corrosive media, the intention being in particular to provide protection against degradation by atmospheres containing steam. Furthermore, the component should be producible simply and reproducibly, as well as reliably usable.

SUMMARY OF THE INVENTION

The present invention provides a component of a composite material, especially a component of a turbomachine. The composite material comprises a ceramic matrix and a corrosion protection layer arranged thereon. The corrosion protection layer comprises from 50 to 80 wt % silicon, from 12 to 30 wt % nitrogen, from 2 to 8 wt % oxygen, from 2 to 8 wt % aluminum, and from 0 to 3 wt % of at least one alkaline earth metal.

In one aspect of the component, corrosion protection layer may comprise from 60 to 70 wt % silicon, from 15 to 25 wt % nitrogen, from 3 to 7 wt % oxygen, from 3 to 7 wt % aluminum, and from 0.1 to 2.5 wt % of at least one alkaline earth metal, or may comprise from 64 to 66 wt % silicon, from 18 to 22 wt % nitrogen, from 4 to 6 wt % oxygen, from 4 to 6 wt % aluminum, and from 1 to 2 wt % of at least one alkaline earth metal.

In another aspect of the component, the ceramic matrix may be formed from at least one material selected from carbon, silicon carbide, aluminum oxide, mullite.

In yet another aspect, the composite material comprising a ceramic matrix may be a fiber composite material comprising ceramic fibers incorporated in the matrix. For example, the ceramic matrix and/or the ceramic fibers may be formed from at least one material that is selected from carbon, silicon carbide, aluminum oxide, mullite.

In a still further aspect of the component of the present invention, at least one adhesion promoter layer may be arranged between the composite material and the corrosion protection layer. For example, the at least one adhesion promoter layer may be formed from a material selected from mullite, silicon, and a mixture of the material of the corrosion protection layer and mullite.

The present invention also provides a method for producing a component of a turbomachine (e.g. a component as set forth above). The method comprises depositing a corrosion protection layer on a semifinished product of a composite material comprising a ceramic matrix. The corrosion protection layer comprises from 50 to 80 wt % silicon, from 12 to 30 wt % nitrogen, from 2 to 8 wt % oxygen, from 2 to 8 wt % aluminum, and from 0 to 3 wt % of at least one alkaline earth metal.

In one aspect of the method, the corrosion protection layer may be applied by at least one process selected from plasma spraying, suspension plasma spraying, low-pressure plasma spraying, physical vapor deposition, chemical vapor deposition, melting, hot-melt coating, brushing, rolling, spraying, and sintering.

The present invention proposes to provide a corrosion protection layer, which comprises or consists of, based on the total weight of the layer, 50-80 wt % silicon, 12-30 wt % nitrogen, 2-8 wt % oxygen, 2-8 wt % aluminum, and 0-3 wt % of at least one alkaline earth metal (e.g., Be, Ca, Mg, Sr and/or Ba), on a component of a composite material comprising a ceramic matrix. Surprisingly, it has been found that a corrosion protection layer having the chemical composition specified above provides good corrosion resistance, particularly including in the presence of steam in the atmosphere.

In particular, the corrosion protection layer may comprise or consist of 60-70 wt %, preferably 64-66 wt % silicon, 15-25 wt %, preferably 18-22 wt % nitrogen, 3-7 wt %, in particular 4-6 wt % oxygen, 3-7 wt %, preferably 4-6 wt % aluminum, and 0.1-2.5 wt %, preferably 1-2 wt % of an alkaline earth metal.

The composite material comprising a ceramic matrix may, in particular, be a fiber composite material comprising incorporated ceramic fibers, in which case the ceramic matrix may be formed from at least one material selected from carbon, silicon carbide, aluminum oxide, and mullite.

The ceramic fibers may be formed from at least one material selected from carbon, silicon carbide, aluminum oxide, and mullite.

An adhesion promoter layer, which improves the adhesion of the corrosion protection layer on the component of the composite material, may additionally be arranged between the corrosion protection layer and the composite material. The adhesion promoter layer may be formed from a material selected from, for example, mullite, silicon and a mixture of the material of the corrosion protection layer and mullite. In particular, the adhesion promoter layer may be formed as a gradient layer in which, for example, there is almost 100% mullite on the side of the component of the composite material and the proportion of the material of the corrosion protection layer in the adhesion promoter layer increases toward the side of the corrosion protection layer and rises to 100%.

The corrosion protection layer may be applied on the semifinished product of the composite material by various processes, for example plasma spraying, suspension plasma spraying, low-pressure plasma spraying, physical vapor deposition (PVD), chemical vapor deposition (CVD), and application of a corresponding slurry by brushing, rolling, or spraying with subsequent sintering, or by melting or hot-melt coating.

BRIEF DESCRIPTION OF THE DRAWINGS

In the appended drawings, purely schematically.

DETAILED DESCRIPTION OF EMBODIMENTS OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show details of the present invention in more detail than is necessary for the fundamental understanding of the present invention, the description in combination with the drawings making apparent to those of skill in the art how the several forms of the present invention may be embodied in practice.

Figure 1:
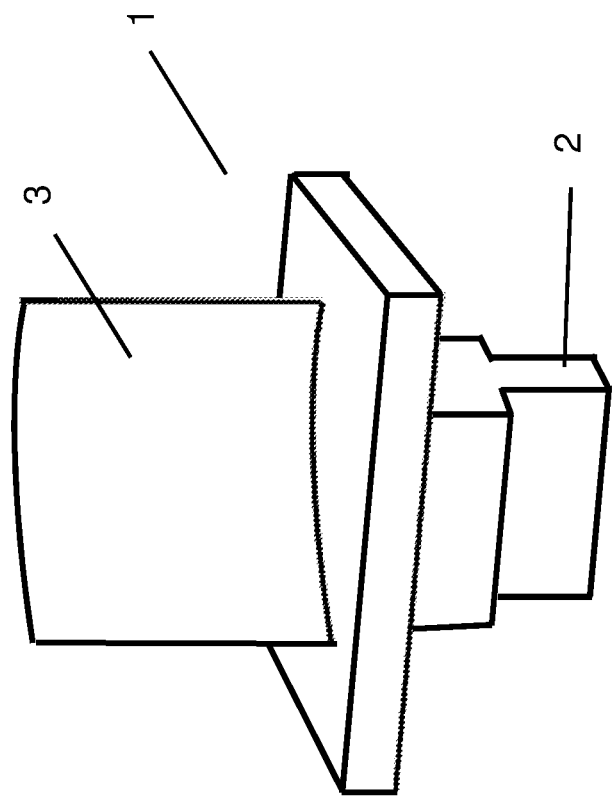
FIG. 1 shows a perspective representation of a blade of a turbomachine, for which the present invention may be used.

FIG. 1 shows purely schematically in a perspective representation a blade such as may be used in a turbomachine. The blade 1 has a blade root 2, which can be fitted into a corresponding recess of a disk, the disk being part of a rotor, so that the blade 1 is rotated in the turbomachine by rotation of the rotor in order to compress fluid flowing in the turbomachine or to be driven by the fluid. Correspondingly, the blade 1 has a blade surface 3 which is arranged in the flow channel of the turbomachine and is sometimes exposed there to high temperatures and aggressive media.

According to the present invention, the blade 1 may be formed from a composite ceramic comprising a ceramic matrix and incorporated ceramic fibers, which has a corrosion protection layer in order to protect the composite ceramic against aggressive media.

Figure 2:
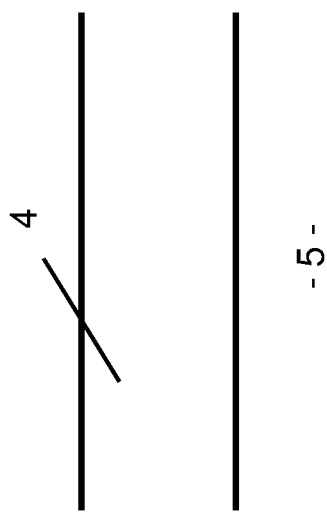
FIG. 2 shows a sectional view through a part of a first embodiment of a component according to the invention.

FIG. 2 shows in a purely schematic representation a partial sectional view through a corresponding component comprising the composite ceramic 5 as a substrate for the corrosion protection layer 4, which has the composition according to the invention comprising silicon, nitrogen, oxygen, aluminum and at least one alkaline earth metal.

Figure 3:
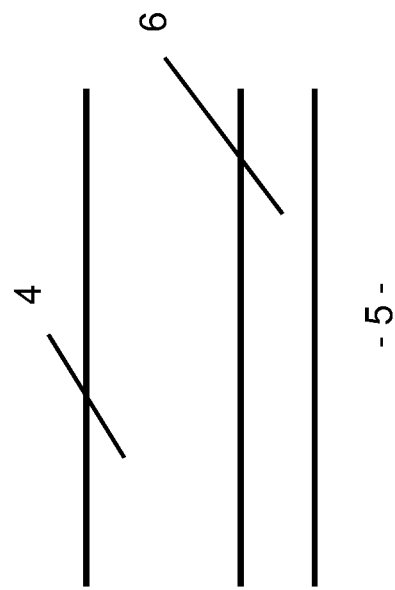
FIG. 3 shows a sectional view through a part of a second embodiment of a component according to the invention.

In the embodiment of FIG. 3, an adhesion promoter layer 6, which may be formed from mullite, silicon or a mixture of the material of the corrosion protection layer 4 and mullite, is additionally formed between the composite ceramic 5 and the corrosion protection layer 4.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

LIST OF REFERENCE NUMERALS 1 blade
2 blade root
3 blade surface
4 corrosion protection layer
5 composite ceramic
6 adhesion promoter layer

What is claimed is:

1. A component of a composite material, wherein the component of the composite material comprises a ceramic matrix and a corrosion protection layer arranged thereon, the corrosion protection layer comprising:
   from 50 to 80 wt % silicon,
   from 12 to 30 wt % nitrogen,
   from 2 to 8 wt % oxygen,
   from 2 to 8 wt % aluminum, and
   from 0 to 3 wt % of at least one alkaline earth metal.

2. The component of claim 1, wherein the corrosion protection layer comprises:
   from 60 to 70 wt % silicon,
   from 15 to 25 wt % nitrogen,
   from 3 to 7 wt % oxygen,
   from 3 to 7 wt % aluminum, and
   from 0.1 to 2.5 wt % of at least one alkaline earth metal.

3. The component of claim 1, wherein the corrosion protection layer comprises:
   from 64 to 66 wt % silicon,
   from 18 to 22 wt % nitrogen,
   from 4 to 6 wt % oxygen,
   from 4 to 6 wt % aluminum, and
   from 1 to 2 wt % of at least one alkaline earth metal.

4. The component of claim 1, wherein the ceramic matrix is formed from at least one material selected from carbon, silicon carbide, aluminum oxide, and mullite.

5. The component of claim 1, wherein the composite material comprising a ceramic matrix is a fiber composite material comprising ceramic fibers incorporated in the matrix.

6. The component of claim 5, wherein the ceramic matrix is formed from at least one material selected from carbon, silicon carbide, aluminum oxide, and mullite.

7. The component of claim 5, wherein the ceramic fibers are formed from at least one material selected from carbon, silicon carbide, aluminum oxide, and mullite.

8. The component of claim 6, wherein the ceramic fibers are formed from at least one material selected from carbon, silicon carbide, aluminum oxide, and mullite.

9. The component of claim 1, wherein at least one adhesion promoter layer is arranged between the composite material and the corrosion protection layer.

10. The component of claim 9, wherein the at least one adhesion promoter layer is formed from a material selected from mullite, silicon, and a mixture of the material of the corrosion protection layer and mullite.

11. The component of claim 5, wherein at least one adhesion promoter layer is arranged between the composite material and the corrosion protection layer.

12. The component of claim 11, wherein the at least one adhesion promoter layer is formed from a material selected from mullite, silicon, and a mixture of the material of the corrosion protection layer and mullite.

13. The component of claim 3, wherein the composite material comprising a ceramic matrix is a fiber composite material comprising ceramic fibers incorporated in the matrix.

14. The component of claim 13, wherein the ceramic matrix is formed from at least one material selected from carbon, silicon carbide, aluminum oxide, and mullite.

15. The component of claim 13, wherein the ceramic fibers are formed from at least one material selected from carbon, silicon carbide, aluminum oxide, and mullite.

16. The component of claim 14, wherein the ceramic fibers are formed from at least one material selected from carbon, silicon carbide, aluminum oxide, and mullite.

17. The component of claim 3, wherein at least one adhesion promoter layer is arranged between the composite material and the corrosion protection layer.

18. The component of claim 17, wherein the at least one adhesion promoter layer is formed from a material selected from mullite, silicon, and a mixture of the material of the corrosion protection layer and mullite.

19. A method for producing a component of a turbomachine, wherein the method comprises depositing a corrosion protection layer on a semifinished product of a composite material comprising a ceramic matrix, the corrosion protection layer comprising
from 50 to 80 wt % silicon,
from 12 to 30 wt % nitrogen,
from 2 to 8 wt % oxygen,
from 2 to 8 wt % aluminum, and
from 0 to 3 wt % of at least one alkaline earth metal.

20. The method of claim 19, wherein the corrosion protection layer is applied by at least one process selected from plasma spraying, suspension plasma spraying, low-pressure plasma spraying, physical vapor deposition, chemical vapor deposition, melting, hot-melt coating, brushing, rolling, spraying, and sintering.

* * * * *